United States Patent
Suda et al.

(10) Patent No.: US 10,003,003 B2
(45) Date of Patent: Jun. 19, 2018

(54) THERMOELECTRIC CONVERSION MODULE

(71) Applicant: NIPPON THERMOSTAT CO., LTD., Tokyo (JP)

(72) Inventors: Hiroshi Suda, Tokyo (JP); Satoshi Ito, Tokyo (JP); Takashi Nemoto, Tokyo (JP); Junichi Sato, Tokyo (JP)

(73) Assignee: NIPPON THERMOSTAT CO., LTD., Tokyo (JP)

( * ) Notice: Subject to any disclaimer, the term of this patent is extended or adjusted under 35 U.S.C. 154(b) by 0 days. days.

(21) Appl. No.: 15/527,013

(22) PCT Filed: Aug. 31, 2015

(86) PCT No.: PCT/JP2015/074636
§ 371 (c)(1),
(2) Date: May 16, 2017

(87) PCT Pub. No.: WO2016/092915
PCT Pub. Date: Jun. 16, 2016

(65) Prior Publication Data
US 2017/0331024 A1     Nov. 16, 2017

(30) Foreign Application Priority Data
Dec. 10, 2014    (JP) .................................. 2014-250325

(51) Int. Cl.
*H01L 35/32* (2006.01)
*H01L 35/08* (2006.01)
(Continued)

(52) U.S. Cl.
CPC .............. *H01L 35/32* (2013.01); *F25B 21/02* (2013.01); *H01L 27/16* (2013.01); *H01L 35/08* (2013.01)

(58) Field of Classification Search
CPC ......... H01L 35/32; H01L 35/08; H01L 27/16; F25B 21/02
See application file for complete search history.

(56) References Cited

U.S. PATENT DOCUMENTS 3,607,444 A * 9/1971 DeBucs .................. F25B 21/02
                                                        136/208
3,617,390 A * 11/1971 De Bucs ................. H01L 35/06
                                                        136/204
(Continued)

FOREIGN PATENT DOCUMENTS

JP          4834986 B       6/2006
JP       2008-244100 A     10/2008
(Continued)

OTHER PUBLICATIONS

International Search Report for Application No. PCT/JP2015/074636 dated Oct. 13, 2015.
(Continued)

*Primary Examiner* — Golam Mowla
(74) *Attorney, Agent, or Firm* — Isshiki International Law Office; Joseph P. Farrar, Esq.

(57) ABSTRACT

A thermoelectric conversion module has a plurality of cold side substrates, a plurality of first electrodes, a plurality of thermoelectric conversion elements, a plurality of second electrodes, X-axis connectors, and Y-axis connectors. The second electrodes are disposed on the cold side substrates six at a time. Between adjacent cold side substrates, two of X-axis connectors as inter-substrate connectors or Y-axis connectors are disposed. One of the plurality of inter-substrate connectors is connected from one of the first electrodes positioned on one of the cold side substrates to one of the second electrodes positioned on another one of the cold side substrates. The other inter-substrate connector is connected from the other one of the first electrodes on the
(Continued)

another one of the cold side substrates to the second electrode on the one cold side substrate.

5 Claims, 5 Drawing Sheets

(51) Int. Cl.
*F25B 21/02* (2006.01)
*H01L 27/16* (2006.01)

(56) References Cited

U.S. PATENT DOCUMENTS

| | | | | |
|---|---|---|---|---|
| 3,714,539 A | * | 1/1973 | Hampl, Jr. | F25B 21/02 |
| | | | | 136/205 |
| 3,884,726 A | * | 5/1975 | Landecker | H01L 35/325 |
| | | | | 136/203 |
| 4,497,973 A | * | 2/1985 | Heath | H01L 35/32 |
| | | | | 136/205 |
| 2003/0033818 A1 | * | 2/2003 | Kucherov | F25B 21/02 |
| | | | | 62/3.1 |
| 2005/0155642 A1 | * | 7/2005 | Chen | H01L 35/00 |
| | | | | 136/252 |
| 2007/0095381 A1 | * | 5/2007 | Lee | H01L 27/16 |
| | | | | 136/230 |
| 2010/0288325 A1 | * | 11/2010 | Takahashi | H01L 35/06 |
| | | | | 136/205 |
| 2011/0139203 A1 | * | 6/2011 | Yap | H01L 35/30 |
| | | | | 136/205 |
| 2014/0338716 A1 | | 11/2014 | Nakajima et al. | |

FOREIGN PATENT DOCUMENTS

| | | |
|---|---|---|
| JP | 2009-176919 A | 8/2009 |
| JP | 2010-171071 A | 8/2010 |
| JP | 2013-115359 A | 6/2013 |
| JP | 2013-161973 | 8/2013 |
| JP | 2014-179539 A | 9/2014 |
| WO | 2012091048 A1 | 7/2012 |

OTHER PUBLICATIONS

International Preliminary Report on Patentability, dated Jun. 13, 2017.
English Translation of International Preliminary Report on Patentability, dated Jun. 13, 2017.

* cited by examiner

THERMOELECTRIC CONVERSION MODULE

CROSS-REFERENCE TO RELATED APPLICATIONS

The present application is a national phase entry under 35 U.S.C. § 371 of International Application No. PCT/JP2015/074636, filed Aug. 31, 2015, which claims priority from Japanese Application No. 2014-250325, filed Dec. 10, 2014, the entire disclosures of which are hereby incorporated by reference herein.

TECHNICAL FIELD

The present invention relates to a thermoelectric conversion module that uses the Seebeck effect to generate electricity and the Peltier effect to carry out cooling and heating.

BACKGROUND ART

Conventionally, a thermoelectric conversion module is known in which a plurality of thermoelectric conversion elements, each having an electrode at both ends, are disposed on a substrate (see, for example, Patent Document No. 1).

The thermoelectric conversion module of Patent Document No. 1 is configured as a so-called pi-leg thermoelectric conversion module, in which two types of thermoelectric conversion elements, n-type thermoelectric conversion elements and p-type thermoelectric conversion elements, are disposed in an alternating arrangement and connected electrically in series.

In the thermoelectric conversion module of Patent Document No. 1, the hot side of the thermoelectric conversion module is disposed not in contact with a heat chamber inside an ohmic-resistance heater covered with thermal insulation material, such that, on the hot side, the thermoelectric conversion module is subjected to radiant heat transfer from the heat chamber. Accordingly, in the thermoelectric conversion module of Patent Document No. 1, the base that functions as the insulation on the hot side is eliminated. If the ohmic-resistance heater is contacted against the heat chamber inside the ohmic-resistance heater, a substrate configured as insulation is provided.

Further, a so-called uni-leg, configured of only one type of thermoelectric conversion element, whether n-type or p-type, is also known (see, for example, Patent Document No. 2).

The thermoelectric conversion module of Patent Document No. 2 has a connector that integrally and electrically connects in series one electrode of one thermoelectric conversion element to the other electrode of an adjacent thermoelectric conversion element, such that the two electrodes and the connector form a U-shaped connector. The U-shaped connector is formed by bending a metal plate. When the thermoelectric conversion module is manufactured, a fixed number of U-shaped connectors are fixedly mounted on the substrate. Then, the thermoelectric conversion elements are pushed into the U-shaped connectors from the side and between two electrodes, and connected to the connectors.

PRIOR ART DOCUMENTS

Patent Documents

Patent Document 1: JP-4834986-B
Patent Document 2: JP-2009-176919-A

SUMMARY OF THE INVENTION

Technical Problem

Thermoelectric conversion elements expand with heat. In addition, the substrate, the electrodes, and the thermoelectric conversion elements each have different coefficients of thermal expansion. Thus, if a bend appears in the substrate when the thermoelectric conversion module is manufactured and the thermoelectric conversion module is mounted on some device with the substrate bent, an unintended stress acts on the thermoelectric conversion elements that can reduce the efficiency of heat transfer.

Moreover, when the thermoelectric conversion module is in use, the repeated expansion and contraction of the substrate, the electrodes, and the thermoelectric conversion elements with changes in temperature can loosen connections between parts. To make it easier to handle the thermal expansion of the thermoelectric conversion elements and to reduce the extent of bending of the substrate, it is possible to divide the substrate on which the electrodes are disposed into multiple parts.

However, dividing the substrate into multiple parts reduces the rigidity of the thermoelectric conversion module. Particularly with a so-called uni-leg thermoelectric conversion module configured of only one type of thermoelectric conversion element, whether n-type or p-type, in which adjacent substrates are likely to be connected by a single bond, the problem of reduced rigidity of the thermoelectric conversion module becomes acute.

The present invention is conceived in light of the above-described problem, and has as its object to provide a thermoelectric conversion module that can suppress any reduction in rigidity of the substrate when the substrate is divided into multiple parts.

Solving the Technical Problem

To achieve the above-described object, the present invention provides a thermoelectric conversion module comprising:
 a plurality of substrates;
 a plurality of first electrodes;
 a plurality of thermoelectric conversion elements each electrically connected at one end to the first electrodes;
 a plurality of second electrodes, electrically connected to another end of each one of the thermoelectric conversion elements; and
 connectors that electrically connect the plurality of first electrodes electrically connected to the thermoelectric conversion elements to the second electrodes electrically connected to adjacent thermoelectric conversion elements,
 a plurality of either the first electrodes or the second electrodes disposed on the substrates,
 a plurality of the connectors disposed between adjacent substrates,
 connectors positioned between adjacent substrates defined as inter-substrate connectors,
 a plurality of the inter-substrate connectors provided between adjacent substrates,
 one of the plurality of inter-substrate connectors connected from a first electrode positioned on one substrate to a second electrode positioned on another substrate, and
 another one of the plurality of inter-substrate connectors connected from a first electrode on the another substrate to a second electrode on the one substrate.

According to the present invention, a plurality of connectors is disposed between adjacent substrates, so the rigidity between substrates increases and rigidity of the thermoelectric conversion module having a plurality of substrates and capable of accommodating thermal expansion can be suppressed (compared to the reduction in rigidity in a case in which the thermoelectric conversion module is composed of a single substrate).

Preferably, the substrates have a plurality of sides, each substrate is adjacent to another substrate on at least two or more of the plurality of sides, and each substrate is connected by the inter-substrate connectors at multiple places on at least two or more of the plurality of sides.

According to the present invention, a plurality of first electrodes and second electrodes positioned on adjacent substrates adjacent to each other on two or more sides are each connected by a plurality of inter-substrate connectors, so that, compared to a case in which the electrodes are connected along only one side, a reduction in rigidity of the thermoelectric conversion module can be suppressed.

In addition, in the present invention, preferably, two axes, along and orthogonal to the substrates, defining an X axis and a Y axis, are provided, and the connectors include X-axis connectors that connect the first electrodes electrically connected to an adjacent one of the thermoelectric conversion elements in an X-axis direction with the second electrodes electrically connected to another adjacent one of the thermoelectric conversion elements in the X-axis direction, and Y-axis connectors that connect the first electrodes electrically connected to an adjacent one of the thermoelectric conversion elements in a Y-axis direction with the second electrodes electrically connected to another adjacent one of the thermoelectric conversion elements in the Y-axis direction, the X-axis connectors disposed between adjacent thermoelectric conversion elements in the X-axis direction, and the Y-axis connectors connect the first electrodes and the second electrodes at ends in the X-axis direction of adjacent thermoelectric conversion elements in the Y-axis direction.

According to the present invention, no Y-axis connectors that connect in the Y-axis direction are positioned between adjacent thermoelectric conversion elements in the Y-axis direction, so the density of the thermoelectric conversion elements per unit area can be improved and the output of the thermoelectric conversion module per unit area can be improved.

In the thermoelectric conversion module of the present invention, the substrates can be cold side substrates disposed on a cold side, and on a hot side, a hot side substrate can be provided for each one of the thermoelectric conversion elements.

With such a configuration, the hot side substrates disposed on the hot side, which are relatively easily susceptible to thermal expansion, are mounted one per each thermoelectric conversion element, thereby further improving the durability of the thermoelectric conversion module against thermal expansion. In addition, a plurality of thermoelectric conversion elements is mounted via the first electrodes or the second electrodes on each of the cold side substrates disposed on the cold side, which are relatively resistant to thermal expansion, so that the rigidity of the thermoelectric conversion module of the present embodiment can be increased compared to a case in which a cold side substrate is provided for each one of the thermoelectric conversion elements.

In the thermoelectric conversion module of the present invention, the plurality of thermoelectric conversion elements can be one of n-type thermoelectric conversion elements and p-type thermoelectric conversion elements, and the plurality of thermoelectric conversion elements can be electrically connected in series.

DETAILED DESCRIPTION OF EMBODIMENTS OF THE INVENTION

Figure 1:
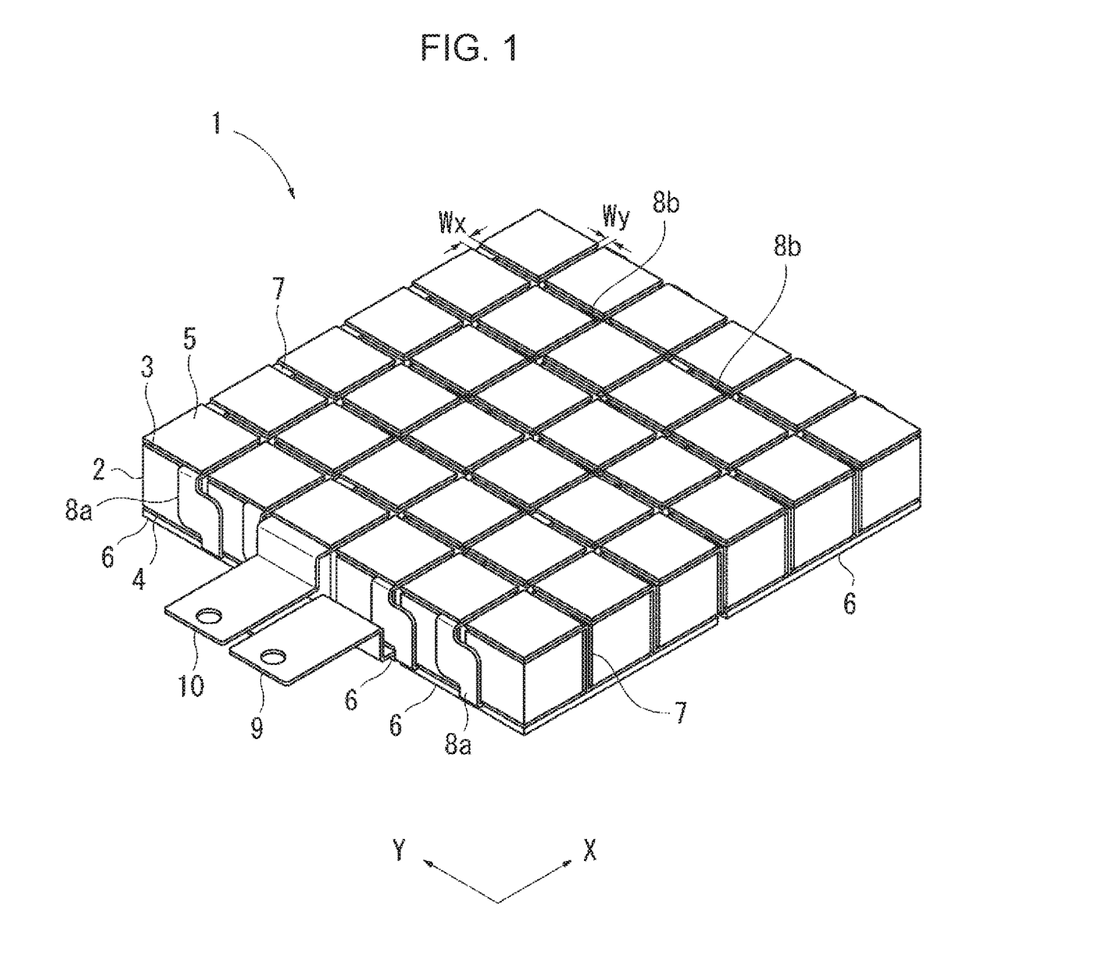
FIG. 1 is a perspective view of an embodiment of a thermoelectric conversion module of the present invention.

With reference to FIG. 1 to FIG. 7, a description is now given of an embodiment of a thermoelectric conversion module of the present invention. A thermoelectric conversion module 1 according to the embodiment shown in FIG. 1 is a so-called uni-leg type, in which a plurality of n-type thermoelectric conversion elements 2 are electrically connected in series.

The thermoelectric conversion elements 2 are made of $Mg_2Si$, shaped in the form of square columns. It should be noted that the shape of the thermoelectric conversion elements 2 is not limited to that of a square column, and may be another form. For example, they may be round, oval, triangular, or any other multilateral columnar shape. Conventionally, the material of the thermoelectric conversion elements has usually been toxic (or potentially toxic) to humans, and expensive. By contrast, $Mg_2Si$ is non-toxic and environmentally friendly, and moreover is plentiful and inexpensive. In addition, because $Mg_2Si$ has a light specific gravity, very light thermoelectric conversion elements 2 can be made. As a result, in recent years, $Mg_2Si$ has become the material of choice for thermoelectric conversion elements.

First electrodes 3 are attached to the top end of the thermoelectric conversion elements 2, so that the thermoelectric conversion elements 2 and the first electrodes 3 are electrically connected to each other. Second electrodes 4 are attached to the bottom end of the thermoelectric conversion elements 2, so that the thermoelectric conversion elements 2 and the second electrodes 4 are electrically connected to each other.

The first electrodes 3 and the second electrodes 4 are formed of copper (Cu) plated with nickel (Ni). The thermoelectric conversion elements are positioned where they will be contacted against the first electrodes 3 and the second electrodes 4 and screen-printed with brazing filler metal for bonding. Alternatively, the brazing filler metal may be provided to the first electrodes 3 and the second electrodes 4, for example, brazing filler metal may be printed onto a sheet of nickel and then the nickel sheet is punched out in the shape of the first electrodes 3 and the second electrodes 4.

Using first electrodes 3 and second electrodes 4 configured in this manner eliminates the need to print the brazing filler metal for each individual first electrode 3 and second electrode 4, thereby reducing the number of printings of the brazing filler metal and thus simplifying the manufacturing process.

The electrodes 3, 4 are not limited to being made of nickel (Ni)-plated copper (Cu) and instead may be made of other material; for example, they may be made of only nickel (Ni). Moreover, as for the method of bonding the electrodes with the conductors, this may be by soldering, brazing, or adhesion or diffusion bonding using an electro-conductive adhesive such as silver paste. The exact method of bonding may be selected as needed depending on the application for which the thermoelectric conversion module is intended.

In the present embodiment, brazing (solder) is printed onto both end portions of the thermoelectric conversion elements 2 by screen printing or the like. It should be noted that silver paste may be used instead of brazing (solder). The surface of the thermoelectric conversion elements 2 consists of minute concavities and convexities, but this uneven surface can be made smooth by covering these concavities and convexities in the surface with brazing (solder) or silver paste, resulting in good bonding between the thermoelectric conversion elements 2 and the electrodes 3, 4 and providing superior electrical conductivity. Moreover, when fabricating the thermoelectric conversion elements 2, a bonding layer of nickel or the like may be formed on both ends of the thermoelectric conversion elements 2 (that is, the top and bottom ends, between the brazing (solder) and the thermoelectric conversion elements 2), to simplify the bond between the thermoelectric conversion elements 2 and the electrodes 3,4. Alternatively, planar elements on predetermined surface(s) (i.e., both sides or one side) of which brazing filler metal has been provided may be used as the electrodes 3, 4.

The thermoelectric conversion module 1 is provided with 36 rectangular (square) hot side substrates 5 (the same number as the number of thermoelectric conversion elements 2) and six rectangular (oblong) cold side substrates 6.

In this specification, the long side of the cold side substrates 6 is the X-axis direction and the direction orthogonal to the X axis is the Y-axis direction. In the thermoelectric conversion module 1 of the present embodiment, the bottom is the cold side and the top is the hot side.

Six cold side substrates 6 are provided, spaced apart, two along the X axis and three along the Y axis. The interval between the cold side substrates 6 is dimensioned sufficient to provide the space needed for thermal expansion of the cold side of the thermoelectric conversion module 1 and for positioning during assembly. The hot side substrates 5 and the cold side substrates 6 are configured as aluminum oxide panels having insulating properties. It should be noted that the hot side substrates 5 and the cold side substrates 6 are not limited to aluminum oxide, and alternatively may be made of another material.

A total of six second electrodes 4 are fixedly mounted on a single cold side substrate 6, three along the X axis and two along the Y axis.

On top of the thermoelectric conversion module 1, the square hot side substrates 5 are provided at every first electrode 3. A hot side substrate 5 is provided at every first electrode 3 because the hot side is more susceptible to thermal expansion. The interval between the hot side substrates 5 is dimensioned sufficient to provide the space needed for thermal expansion of the hot side of the thermoelectric conversion module 1 and for positioning during assembly.

It should be noted that the hot side substrates 5 may be configured as rectangular (oblong) panels like the cold side substrates 6, with six first electrodes 3, although with a slight reduction in thermal expansion durability. When the hot side substrates are made rigid in this manner, the cold side substrates are not needed if the heat source is insulated from the cold side of the thermoelectric conversion module 1 or the heat source is configured so that it can radiate heat (cool off) without contacting the cold side substrates of the thermoelectric conversion module 1. However, when the thermoelectric conversion module is used contacted against a heat source having a housing made of an electrically conductive material such as metal, the cold side substrates 6 are necessary to prevent short-circuiting. In this case, the cold side substrates 6 can also be divided into one for each thermoelectric conversion element.

The material for the hot side substrates 5 and the cold side substrates 6 may be varied as necessary depending on the heat source against which the module is contacted. For example, the hot side substrates may be configured as a flexible, insulating, thermally conductive sheet.

The X-axis direction and the Y-axis direction are defined as shown in FIG. 1. The thermoelectric conversion module 1 of the present embodiment is configured with six thermoelectric conversion elements 2 along the X axis and six thermoelectric conversion elements 2 along the Y axis, for a total of 36 thermoelectric conversion elements 2 comprising one thermoelectric conversion module 1.

Figure 2:
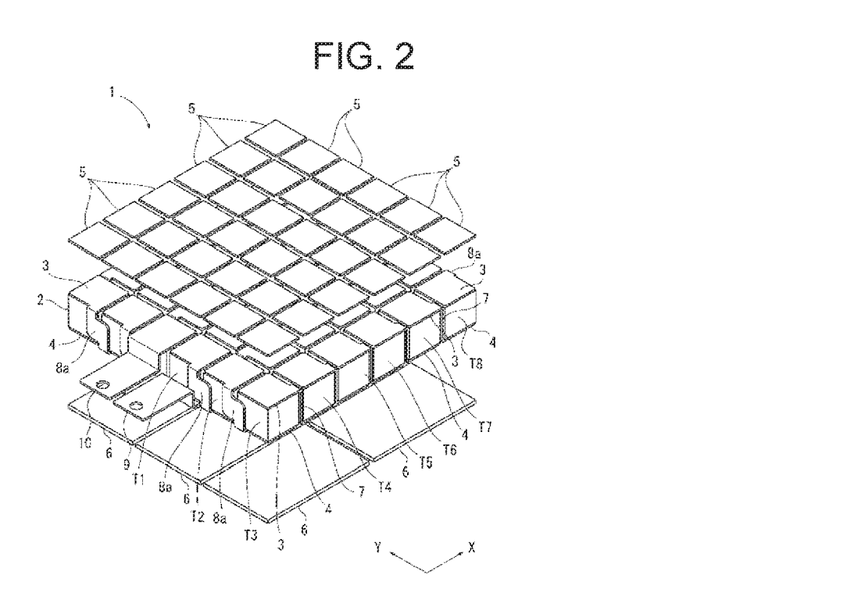
FIG. 2 is an exploded perspective view of the thermoelectric conversion module of the embodiment.

FIG. 2 shows the thermoelectric conversion module 1 with the hot side substrates 5 at the top and the cold side substrates 6 at the bottom and the electrodes 3, 4 separated.

Figure 3:
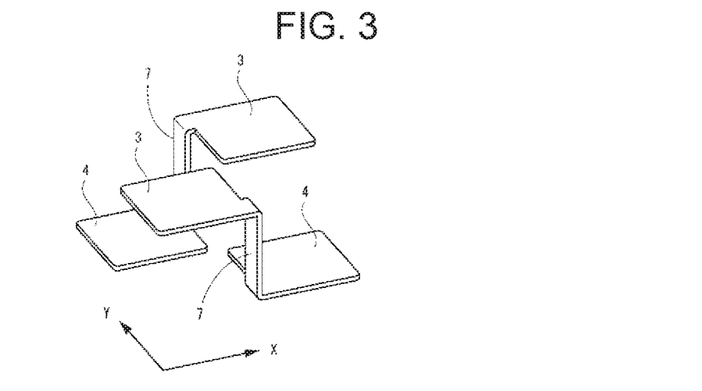
FIG. 3 is a perspective view of the X-axis connectors.

FIG. 3 shows X-axis connectors 7 that connect a first electrode 3 and a second electrode 4 provided on a thermoelectric conversion element 2 adjacent in the X-axis direction to the thermoelectric conversion element 2 on which the first electrode 3 is provided. The connector 7 is formed as a single integrated unit with the first electrode 3 and the second electrode 4. The first electrode 3, the second electrode 4, and the X-axis connector 7 are bent into the shape of a crank after being punched out of a single sheet of metal.

Figure 4:
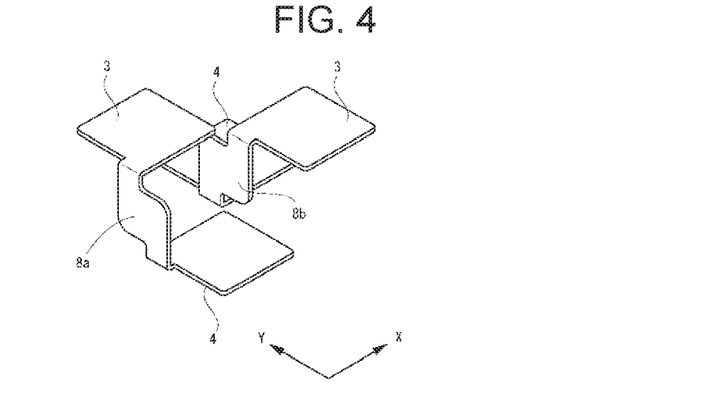
FIG. 4 is a perspective view of the Y-axis connectors.

FIG. 4 shows X-axis connectors 8a, 8b that connect a first electrode 3 and a second electrode 4 provided on a thermoelectric conversion element 2 adjacent in the Y-axis direction to the thermoelectric conversion element 2 on which the first electrode 3 is provided. The Y-axis connectors 8a, 8b are formed as a single integrated unit with the first electrode 3 and the second electrode 4. The first electrodes 3, the second electrodes 4, and the Y-axis connectors 8a, 8b are bent into the shape of a crank after being punched out of a single sheet of metal.

It should be noted that the when the Y-axis connector 8a is positioned on one side of the first electrode 3 in the X-axis direction (the front; the lower left in FIG. 4), the Y-axis connector 8a connects the first electrode 3 and the second electrode 4 that is electrically connected to the thermoelectric conversion element 2 adjacent on one side in the Y-axis direction (the right; the lower right in FIG. 4) to the thermoelectric conversion element 2 electrically connected to this first electrode 3.

By contrast, when the Y-axis connector 8b is positioned on one side of the first electrode 3 in the X-axis direction (the front; the lower left in FIG. 4), the Y-axis connector 8b connects the first electrode 3 and the second electrode 4 that is electrically connected to the thermoelectric conversion element 2 adjacent on one side in the Y-axis direction (the left; the upper left in FIG. 4) to the thermoelectric conversion element 2 electrically connected to this first electrode 3.

Figure 5:
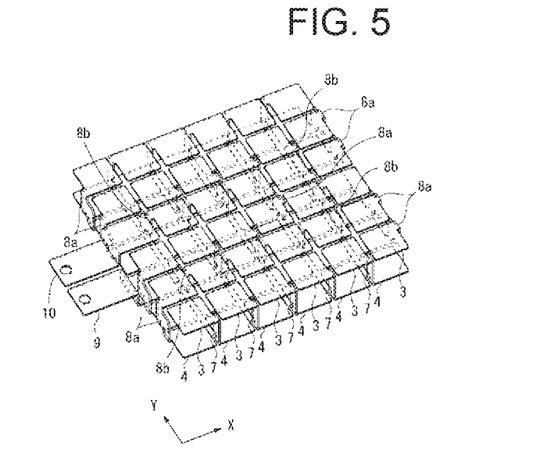
FIG. 5 is a perspective view of the first electrodes, the second electrodes, and the connectors, omitting the thermoelectric conversion elements and the substrates of the thermoelectric conversion module of the present embodiment.
Figure 6:
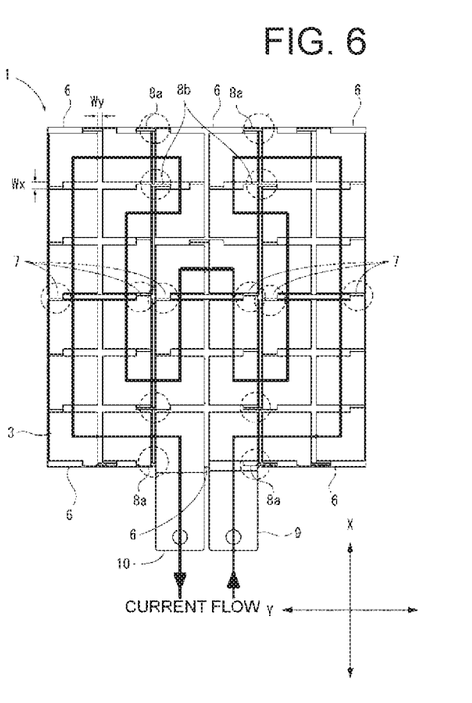
FIG. 6 is a plan view of the flow of electric current through the thermoelectric conversion module of the present embodiment.

FIG. 5 shows the first electrodes 3, the second electrodes 4, the X-axis connectors 7 and the Y-axis connectors 8a, 8b while omitting the thermoelectric conversion elements 2, the hot side substrates 5, and the cold side substrates 6. FIG. 6 shows the flow of electric current through the thermoelectric conversion module 1 of the present embodiment. The areas encircled by broken lines in FIG. 6 indicate the X-axis connectors 7 or the Y-axis connectors 8a, 8b that connect the cold side substrates 6.

Figure 7:
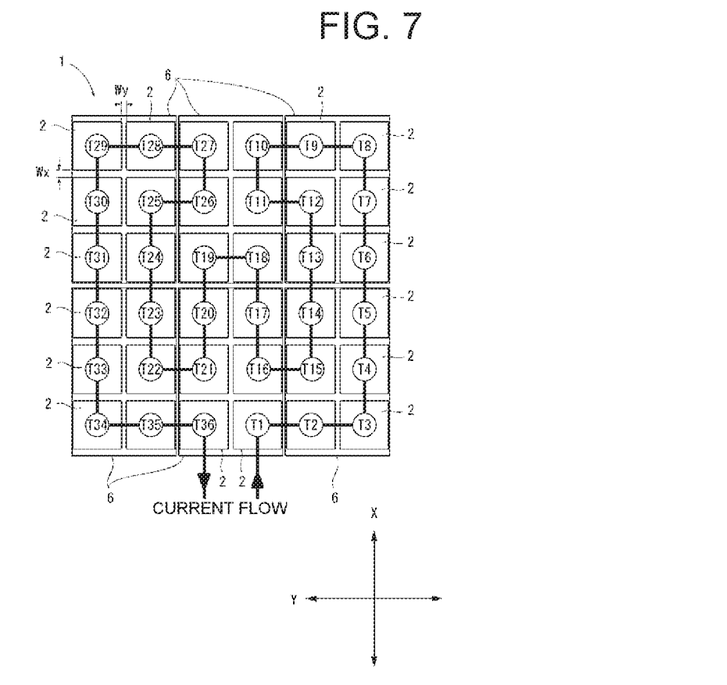
FIG. 7 is a schematic view of the flow of electric current through the thermoelectric conversion module of the present embodiment.

FIG. 7 shows the order of the flow of electric current between terminals, showing the thermoelectric conversion elements 2 numbered from a $1^{st}$ thermoelectric conversion element T1 to a $36^{th}$ thermoelectric conversion element T36. As can be seen by reference to FIG. 2, a first terminal 9 and a second terminal 10 are provided on the two center thermoelectric conversion elements 2 positioned farthest to the front of the six thermoelectric conversion elements 2 disposed on the cold side substrate 6 positioned (the lower left in FIG. 2).

More specifically, the first terminal 9 is provided to the second electrode 4 electrically connected to the bottom of the $1^{st}$ thermoelectric conversion element T1. The first terminal 9 is bent in the shape of a crank, upward from the front end of the second electrode 4 (the lower left in FIG. 2) and forward from approximately the center of the $1^{st}$ thermoelectric conversion element T1 in the vertical direction.

The second terminal 10 is provided to the first electrode 3 electrically connected to the top of the $36^{th}$ thermoelectric conversion element T36. The second terminal 10 is bent in the shape of a crank, downward from the front end of the first electrode 3 (the lower left in FIG. 2) and forward from approximately the center of the $36^{th}$ thermoelectric conversion element T36 in the vertical direction.

The first electrode 3 electrically connected to the top of the $1^{st}$ thermoelectric conversion element T1 is electrically connected to the second electrode 4 electrically connected to the bottom of the $2^{nd}$ thermoelectric conversion element T2 that is the adjacent thermoelectric conversion element 2 in the Y-axis direction by the Y-axis connector 8a. This Y-axis connector 8a is one of the inter-substrate connectors. The first electrode 3 electrically connected to the top of the $2^{nd}$ thermoelectric conversion element T2 is electrically connected to the bottom of the $3^{rd}$ thermoelectric conversion element T3 that is the adjacent thermoelectric conversion element 2 in the Y-axis direction by the Y-axis connector 8a.

The first electrode 3 electrically connected to the top of the $3^{rd}$ thermoelectric conversion element T3 is connected to the second electrode 4 electrically connected to the bottom of the $4^{th}$ thermoelectric conversion element T4 that is the adjacent thermoelectric conversion element 2 in the X-axis direction by the X-axis connector 7.

Similarly, the first electrodes 3 electrically connected to the tops of the $4^{th}$ through $7^{th}$ thermoelectric conversion elements T4-T7 are connected to the second electrodes 4 electrically connected to the bottoms of the $5^{th}$ through $8^{th}$ thermoelectric conversion elements T5-T8 that are the adjacent thermoelectric conversion elements 2 in the X-axis direction by the X-axis connectors 7. The X-axis connector 7 positioned between the $5^{th}$ thermoelectric conversion element T5 and the $6^{th}$ thermoelectric conversion element T6 is one of the inter-substrate connectors.

As can be seen by reference to FIG. 5 and FIG. 7, the first electrode 3 electrically connected to the top of the $8^{th}$ thermoelectric conversion element T8 is connected to the second electrode 4 electrically connected to the bottom of the $9^{th}$ thermoelectric conversion element T9 that is the thermoelectric conversion element adjacent in the Y-axis direction by the y-axis connector 8a.

The first electrode 3 electrically connected to the top of the $9^{th}$ thermoelectric conversion element T9 is connected to the second electrode 4 electrically connected to the bottom of the $10^{th}$ thermoelectric conversion element T10 that is the thermoelectric conversion element 2 adjacent in the Y-axis direction by the Y-axis connector 8a. This Y-axis connector 8a is one of the inter-substrate connectors.

The first electrode 3 electrically connected to the top of the $10^{th}$ thermoelectric conversion element T10 is connected to the second electrode 4 electrically connected to the bottom of the $11^{th}$ thermoelectric conversion element T11 that is the thermoelectric conversion element 2 adjacent in the X-axis direction by the X-axis connector 7. It should be noted that, in the present embodiment, the X-axis connectors 7 are positioned on the right when viewing the connected second electrodes 4 from the first electrodes 3.

The first electrode 3 electrically connected to the top of the $11^{th}$ thermoelectric conversion element T11 is connected to the second electrode 4 electrically connected to the bottom of the $12^{th}$ thermoelectric conversion element T12 that is the adjacent thermoelectric conversion element 2 in the Y-axis direction by the Y-axis connector 8b. This Y-axis connector 8b is one of the inter-substrate connectors.

The Y-axis connector 8b, when viewed from the first electrode 3 toward the connected second electrode 4, connects the left sides of the electrodes 3, 4, and also connects portions contiguous to the sides. As a result, space can be provided between portions of the left sides of the electrodes 3, 4 that are mutually isolated from each other, and in this space the x-axis connector 7 positioned between the $10^{th}$ thermoelectric conversion element T10 and the $11^{th}$ thermoelectric conversion element T11 can be disposed. By so doing, contact between the Y-axis connector 8b and the X-axis connector 7 positioned between the $10^{th}$ thermoelectric conversion element T10 and the $11^{th}$ thermoelectric conversion element T11 can be prevented, and moreover, the Y-axis connector 7 positioned between the $11^{th}$ thermoelectric conversion element T11 and the $12^{th}$ thermoelectric conversion element T12 can be disposed without widening the interval in the X-axis direction between adjacent thermoelectric conversion elements 2.

The first electrode 3 electrically connected to the top of the $12^{th}$ thermoelectric conversion element T12 is connected to the second electrode 4 electrically connected to the bottom of the $13^{th}$ thermoelectric conversion element T13 that is the adjacent thermoelectric conversion element 2 in the X-axis direction by the X-axis connector 7.

The first electrode 3 electrically connected to the top of the $13^{th}$ thermoelectric conversion element T13 is connected to the second electrode 4 electrically connected to the bottom of the $14^{th}$ thermoelectric conversion element T14 that is the adjacent thermoelectric conversion element 2 in the X-axis direction by the X-axis connector 7. This X-axis connector 7 is one of the inter-substrate connectors.

The first electrode 3 electrically connected to the top of the $14^{th}$ thermoelectric conversion element T14 is connected to the second electrode 4 electrically connected to the bottom of the $15^{th}$ thermoelectric conversion element T15 that is the adjacent thermoelectric conversion element 2 in the X-axis direction by the X-axis connector 7.

The first electrode 3 electrically connected to the top of the $15^{th}$ thermoelectric conversion element T15 is connected to the second electrode 4 electrically connected to the bottom of the 16$^{th}$ thermoelectric conversion element T16 that is the adjacent thermoelectric conversion element 2 in the Y-axis direction by the Y-axis connector 8b. This Y-axis connector 8b is one of the inter-substrate connectors.

The first electrode 3 electrically connected to the top of the 16$^{th}$ thermoelectric conversion element T16 is connected to the second electrode 4 electrically connected to the bottom of the 17$^{th}$ thermoelectric conversion element T17 that is the adjacent thermoelectric conversion element 2 in the X-axis direction by the X-axis connector 7.

The first electrode 3 electrically connected to the top of the 17$^{th}$ thermoelectric conversion element T17 is connected to the second electrode 4 electrically connected to the bottom of the 18$^{th}$ thermoelectric conversion element T18 that is the adjacent thermoelectric conversion element 2 in the X-axis direction by the X-axis connector 7. This X-axis connector 7 is one of the inter-substrate connectors.

The first electrode 3 electrically connected to the top of the 18$^{th}$ thermoelectric conversion element T18 is connected to the second electrode 4 electrically connected to the bottom of the 19$^{th}$ thermoelectric conversion element T19 that is the adjacent thermoelectric conversion element 2 in the Y-axis direction by the Y-axis connector 8a.

The first electrode 3 electrically connected to the top of the 19$^{th}$ thermoelectric conversion element T19 is connected to the second electrode 4 electrically connected to the bottom of the 20$^{th}$ thermoelectric conversion element T20 that is the adjacent thermoelectric conversion element 2 in the X-axis direction by the X-axis connector 7. This X-axis connector 7 is one of the inter-substrate connectors.

The first electrode 3 electrically connected to the top of the 20$^{th}$ thermoelectric conversion element T20 is connected to the second electrode 4 electrically connected to the bottom of the 21$^{st}$ thermoelectric conversion element T21 that is the adjacent thermoelectric conversion element 2 in the X-axis direction by the X-axis connector 7.

The first electrode 3 electrically connected to the top of the 21$^{st}$ thermoelectric conversion element T21 is connected to the second electrode 4 electrically connected to the bottom of the 22$^{nd}$ thermoelectric conversion element T22 that is the adjacent thermoelectric conversion element 2 in the Y-axis direction by the Y-axis connector 8b. This Y-axis connector 8b is one of the inter-substrate connectors.

The first electrodes 3 electrically connected to the tops of the 22$^{nd}$ through 24$^{th}$ thermoelectric conversion elements T22-T24 are connected to the second electrodes 4 electrically connected to the bottoms of the 23$^{rd}$ through 25$^{th}$ thermoelectric conversion elements T23-T25 that are the adjacent thermoelectric conversion elements 2 in the X-axis direction by the X-axis connectors 7. The X-axis connector 7 positioned between the 23$^{rd}$ thermoelectric conversion element T23 and the 24$^{th}$ thermoelectric conversion element T24 is one of the inter-substrate connectors.

The first electrode 3 electrically connected to the top of the 25$^{th}$ thermoelectric conversion element T25 is connected to the second electrode 4 electrically connected to the bottom of the 26$^{th}$ thermoelectric conversion element T26 that is the adjacent thermoelectric conversion element 2 in the Y-axis direction by the Y-axis connector 8b. This Y-axis connector 8b is one of the inter-substrate connectors.

The first electrode 3 electrically connected to the top of the 26$^{th}$ thermoelectric conversion element T26 is connected to the second electrode 4 electrically connected to the bottom of the 27$^{th}$ thermoelectric conversion element T27 that is the adjacent thermoelectric conversion element 2 in the X-axis direction by the X-axis connector 7.

The Y-axis connector 8b positioned between the 25$^{th}$ thermoelectric conversion element T25 and the 26$^{th}$ thermoelectric conversion element T26, when viewed from the first electrode 3 toward the connected second electrode 4, connects the left sides of the electrodes 3, 4, and also connects portions contiguous to the sides. As a result, space can be provided between portions of the left sides of the electrodes 3, 4 that are mutually isolated from each other, and in this space the x-axis connector 7 positioned between the 26$^{th}$ thermoelectric conversion element T26 and the 27$^{th}$ thermoelectric conversion element T27 can be disposed. By so doing, contact between the Y-axis connector 8b and the X-axis connector 7 positioned between the 26$^{th}$ thermoelectric conversion element T26 and the 27$^{th}$ thermoelectric conversion element T27 can be prevented, and moreover, the Y-axis connector 7 positioned between the 25$^{th}$ thermoelectric conversion element T25 and the 26$^{th}$ thermoelectric conversion element T26 can be disposed without widening the interval in the X-axis direction between adjacent thermoelectric conversion elements 2.

The first electrode 3 electrically connected to the top of the 27$^{th}$ thermoelectric conversion element T27 is connected to the second electrode 4 electrically connected to the bottom of the 28$^{th}$ thermoelectric conversion element T28 that is the adjacent thermoelectric conversion element 2 in the Y-axis direction by the Y-axis connector 8a. This Y-axis connector 8a is one of the inter-substrate connectors.

The first electrode 3 electrically connected to the top of the 28$^{th}$ thermoelectric conversion element T28 is connected to the second electrode 4 electrically connected to the bottom of the 29$^{th}$ thermoelectric conversion element T29 that is the adjacent thermoelectric conversion element 2 in the Y-axis direction by the Y-axis connector 8a.

The first electrodes 3 electrically connected to the tops of the 29$^{th}$ through 33$^{rd}$ thermoelectric conversion elements T29-T33 are connected to the second electrodes 4 electrically connected to the bottoms of the 30th through 34$^{th}$ thermoelectric conversion elements T30-T34 that are the adjacent thermoelectric conversion elements 2 in the X-axis direction by the X-axis connectors 7. The X-axis connector 7 positioned between the 31$^{st}$ thermoelectric conversion element T31 and the 32$^{nd}$ thermoelectric conversion element T32 is one of the inter-substrate connectors.

The first electrode 3 electrically connected to the top of the 34$^{th}$ thermoelectric conversion element T34 is connected to the second electrode 4 electrically connected to the bottom of the 35$^{th}$ thermoelectric conversion element T35 that is the adjacent thermoelectric conversion element 2 in the Y-axis direction by the Y-axis connector 8a.

The first electrode 3 electrically connected to the top of the 35$^{th}$ thermoelectric conversion element T35 is connected to the second electrode 4 electrically connected to the bottom of the 36$^{th}$ thermoelectric conversion element T36 that is the adjacent thermoelectric conversion element 2 in the Y-axis direction by the Y-axis connector 8a. This Y-axis connector 8a is one of the inter-substrate connectors.

Next, a description is given of the operation of the thermoelectric conversion module of the present embodiment. If the hot side substrate 5 on the top side of the thermoelectric conversion module 1 is mounted on a heat source of, for example, 300° C. to 600° C., and the cold side substrate 6 on the bottom side is cooled, a temperature difference arises between the two ends of the thermoelectric conversion elements 2 and an electric current begins to flow due to the Seebeck effect, generating electricity, and when the first terminal 9 and the second terminal 10 are connected to an external load and form a circuit, current flows and power is generated. At this time, in order to continue to generate electricity, it is necessary to continue to maintain a predetermined temperature difference between the two ends of the thermoelectric conversion elements 2. However, in the present embodiment, the material used for the thermoelectric conversion elements 2 is $Mg_2Si$, and so good maintenance of a temperature difference can be achieved.

With the thermoelectric conversion module 1 of the first embodiment, of the two inter-substrate connectors positioned between adjacent cold side substrates 6, one is connected from one first electrode 3 positioned on one cold side substrate 6 to one second electrode 4 positioned on the other cold side substrate 6. Conversely, the other connector between substrates is connected from the other first electrode 3 positioned on the other cold side substrate 6 to the other second electrode 4 positioned on the other cold side substrate 6.

For example, as shown in FIG. 3 the X-axis connectors 7 disposed between adjacent cold side substrates 6 in the X-axis direction cross when viewed from the Y-axis direction.

As shown in FIG. 4, the Y-axis connectors 8a, 8b disposed between adjacent cold side substrates 6 in the Y-axis direction cross when viewed from the X-axis direction.

Accordingly, with the thermoelectric conversion module 1 of the first embodiment, because multiple (two) connectors are provided between substrates between adjacent cold side substrates 6 and are such that the connectors cross, continuous rigidity between cold side substrates 6 increases and reduced rigidity of the thermoelectric conversion module 1 provided with a plurality of (six) cold side substrates capable of accommodating thermal expansion can be suppressed (compared to the reduction in rigidity in a case in which the thermoelectric conversion module is composed of a single substrate).

In addition, in the thermoelectric conversion module 1 of the present embodiment, the cold side substrates 6 are oblong-shaped with four sides. Six cold side substrates 6 are provided, two along the X axis and three along the Y axis, so that any given cold side substrate 6 is adjacent to another cold side substrate 6 on at least two or more sides. Each cold side substrate 6 is connected at two places by inter-substrate connectors on at least two of the four sides.

Accordingly, the thermoelectric conversion module 1 of the present embodiment can suppress a reduction in rigidity of the thermoelectric conversion module compared to a case in which the cold side substrates are connected on only one side.

In the thermoelectric conversion module 1 of the present embodiment, the X-axis connectors 7 are disposed between adjacent thermoelectric conversion elements 2 in the X-axis direction and the Y-axis connectors 8a, 8b are disposed so that the first electrodes 3 and the second electrodes 4 are connected at the X-axis direction side ends of adjacent thermoelectric conversion elements in the Y-axis direction. That is, viewed from the Y-axis direction, between adjacent thermoelectric conversion elements 2 in the Y-axis direction, no connectors 7, 8a, 8b are positioned.

Accordingly, an interval Wy in the Y-axis direction between thermoelectric conversion elements 2 in which no connectors are present can be made smaller than an interval Wx in the X-axis direction between thermoelectric conversion elements 2 in which connectors 7, 8a, 8b are disposed.

As a result, the thermoelectric conversion module 1 of the present embodiment can improve the density of thermoelectric conversion elements 2 per unit area and thus can improve output per unit area.

It should be noted that although there will be a decrease in density of the thermoelectric conversion elements 2 per unit area the Y-axis connectors may be configured like the X-axis connectors 7. With this configuration as well, the effect of the present invention, which is to suppress a reduction in rigidity of the thermoelectric conversion module, can be achieved.

The thermoelectric conversion module 1 of the present embodiment is configured so that hot side substrates 5 disposed on the hot side, which are relatively easily susceptible to thermal expansion, are mounted one per each thermoelectric conversion element via the first electrodes 3, thereby further improving the durability of the thermoelectric conversion module 1 against thermal expansion. In addition, because each of the cold side substrates 6 disposed on the cold side, which are relatively resistant to thermal expansion, are configured so that multiple (six) thermoelectric conversion elements are disposed on each one of the cold side substrate 6 via the second electrodes 4, the rigidity of the thermoelectric conversion module of the present embodiment can be increased compared to a case in which a cold side substrate is provided for each one of the thermoelectric conversion elements.

It should be noted that the number and disposition of the thermoelectric conversion elements 2 and the number and disposition of the cold side substrates 6 may be varied as convenient so long as the effect of the present invention is achieved.

Although the thermoelectric conversion elements 2 of the present embodiment are shown as rectangular columns in FIG. 2, the shape of the thermoelectric conversion elements is not limited thereto and they may be, for example, round.

Although in the present embodiment the thermoelectric conversion elements 2 are made of $Mg_2Si$, the material thereof is not limited thereto. Accordingly, the thermoelectric conversion elements 2 may be made of any thermoelectric conversion material, for example, a Bi—Te compound containing an Sb—Te compound and a Bi—Se compound, a Pb—Te compound containing a Sn—Te compound and a Ge—Te compound, a Ag—Sb—Te compound, a Ag—Sb—Ge—Te compound, a Si—Ge compound, a Fe—Si compound, a Mn—Si compound, a Zn—Sb compound, a chalcogenide, skutterudite, filled skutterudite, clathrate, half-Heusler, Heusler, boron carbide, layered cobalt oxide, or the like.

Although the present embodiment has been described using n-type thermoelectric conversion elements 2, the thermoelectric conversion elements 2 are not limited thereto and p-type elements alone may be used. In this case, the direction of the electric current is reversed. Further, the $Mg_2Si$ need not be of high purity, and may, for example, be silicon sludge ejected during cutting and polishing.

A bonding layer to reduce contact resistance with the electrodes may be provided on the two ends of the thermoelectric conversion elements 2. The bonding layer can be formed as a single unit with the thermoelectric conversion elements. Any of Ni, Al, Cu, W, Au, Ag, Co, Mo, Cr, Ti, Pd, or an alloy of these, may be used for the bonding layer and electrodes.

Although the thermoelectric conversion module 1 is described as used to generate electricity using the Seebeck effect in the foregoing embodiment, the thermoelectric conversion module of the present invention can also be similarly used to cool or to heat using the Peltier effect.

Although in the foregoing embodiment the top of the thermoelectric conversion module 1 shown in FIG. 1 is contacted against a heat source and is the hot side, and the bottom is the heat-dispersing cold side, the use of the thermoelectric conversion module of the present invention is not limited thereto. For example, in FIG. 1, the top may be made the cold side and the bottom may be made the hot side.

The positions of the first terminal 9 and the second terminal 10 may be varied as convenient so long as the inter-substrate connectors are not omitted. In this case, the first electrode electrically 3 connected to the top of the 36th thermoelectric conversion elements T3 may be connected to the second electrode 4 electrically connected to the bottom of the 1st thermoelectric conversion element T1 that is the adjacent thermoelectric conversion element 2 in the Y-axis direction by the Y-axis connector 8a.

Although the present embodiment has been described using a thermoelectric conversion module in which all the thermoelectric conversion elements are connected in series, the thermoelectric conversion module of the present embodiment is not limited to such a configuration. Thus, provided that the inter-substrate connectors cross and their effect is achieved, for example, some or all of the thermoelectric conversion elements may be connected in parallel.

Figure 8:
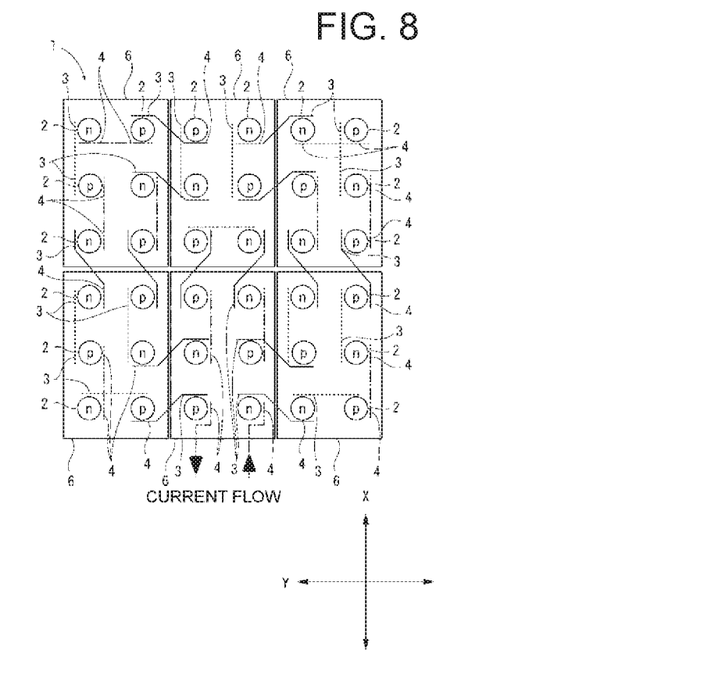
FIG. 8 is a schematic view of a thermoelectric conversion module of another embodiment of the present invention.
Figure 9:
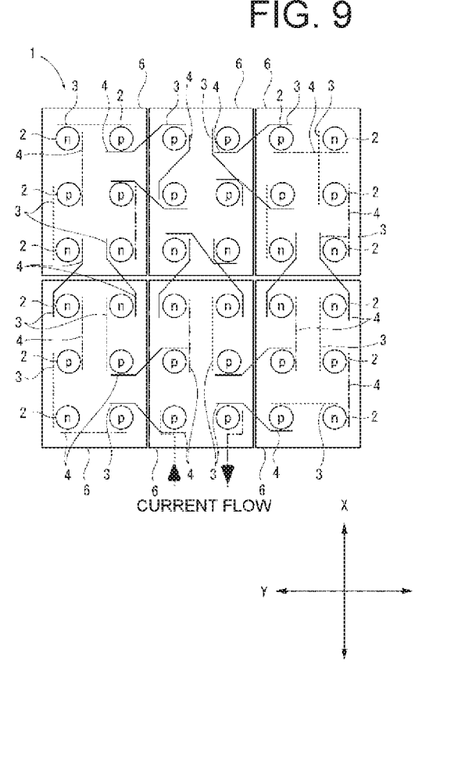
FIG. 9 is a schematic view of a thermoelectric conversion module of yet another embodiment of the present invention.

As with other embodiments shown in FIG. 8 and FIG. 9, the thermoelectric conversion module may be configured using both n-type thermoelectric conversion elements 2 and p-type thermoelectric conversion elements 2. In FIG. 8 and FIG. 9, the broken lines indicate first electrodes 3, the dot-and-dash lines indicate second electrodes 4, n indicates n-type thermoelectric conversion elements 2, and p indicates p-type thermoelectric conversion elements 2.

In FIG. 8 and FIG. 9, in the case of connecting the first electrodes 3 or the second electrodes 4 in the X-axis direction, the first electrodes 3 positioned on top are shown disposed on the left of the thermoelectric conversion elements 2 in the drawing and the second electrodes 4 positioned on the bottom are shown disposed on the right of the thermoelectric conversion elements 2 in the drawing. In addition, in FIG. 8 and FIG. 9, in the case of connecting the first electrodes 3 or the second electrodes 4 in the Y-axis direction, the first electrodes 3 positioned on top are shown disposed on at the top of the thermoelectric conversion elements 2 in the drawing and the second electrodes 4 positioned on the bottom are shown disposed at the bottom of the thermoelectric conversion elements 2 in the drawing.

With the thermoelectric conversion module 1 of another embodiment shown in FIG. 8, inter-substrate connectors disposed on the same sides between adjacent cold side substrates 6 are connected in the same direction from the first electrodes 3 to the second electrodes 4. However, compared to inter-substrate connectors disposed between sides of adjacent cold side substrates 6 in the X-axis direction and the Y-axis direction, the first electrodes 3 and the second electrodes 4 are connected in such a way that the connectors cross. By so doing, this other embodiment of thermoelectric conversion module 1 of FIG. 8 can improve the rigidity of the thermoelectric conversion module compared to a case in which the inter-substrate connectors are connected in the same direction from the first electrodes 3 to the second electrodes 4.

Alternatively, as with another embodiment shown in FIG. 9, the thermoelectric conversion module may be configured using both n-type thermoelectric conversion elements 2 and p-type thermoelectric conversion elements 2, with one of the inter-substrate connectors disposed on the same sides between adjacent cold side substrates 6 connected from one first electrode 3 to one second electrode 4, and the other of the inter-substrate connectors connected from the other first electrode 3 to the other second electrode 4. With this configuration as well, the rigidity of the thermoelectric conversion module 1 can be improved.

LIST OF REFERENCE NUMBERS

1 Thermoelectric conversion module
2 Thermoelectric conversion elements
3 First electrodes
4 Second electrodes
5 Hot side substrates
6 Cold side substrates
7 X-axis connector
8a Y-axis connector
8b Y-axis connector
8 First terminal
10 Second terminal
T1-T36 1st through 36th thermoelectric conversion elements

What is claimed is:

1. A thermoelectric conversion module comprising:
a plurality of substrates;
a plurality of first electrodes;
a plurality of thermoelectric conversion elements each electrically connected at one end to the first electrodes;
a plurality of second electrodes, electrically connected to another end of each one of the thermoelectric conversion elements; and
connectors that electrically connect the plurality of first electrodes electrically connected to the thermoelectric conversion elements to the second electrodes electrically connected to adjacent thermoelectric conversion elements,
a plurality of either the first electrodes or the second electrodes disposed on the substrates,
a plurality of the connectors disposed between adjacent substrates,
connectors positioned between adjacent substrates defined as inter-substrate connectors,
a plurality of the inter-substrate connectors provided between adjacent substrates,
one of the plurality of inter-substrate connectors connected from a first electrode positioned on one substrate to a second electrode positioned on another substrate, and another one of the plurality of inter-substrate connectors connected from a first electrode on the another substrate to a second electrode on the one substrate.

2. The thermoelectric conversion module as claimed in claim 1,
wherein the substrates have a plurality of sides,
each substrate is adjacent to another substrate on at least two or more of the plurality of sides, and
each substrate is connected by the inter-substrate connectors at multiple places on at least two or more of the plurality of sides.

3. The thermoelectric conversion module as claimed in claim 1,
wherein two axes, along and orthogonal to the substrates, are an X axis and a Y axis,
wherein the connectors include X-axis connectors that connect the first electrodes electrically connected to an adjacent one of the thermoelectric conversion elements in an X-axis direction with the second electrodes electrically connected to another adjacent one of the thermoelectric conversion elements in the X-axis direction, and Y-axis connectors that connect the first electrodes electrically connected to an adjacent one of the thermoelectric conversion elements in a Y-axis direction with the second electrodes electrically connected to another adjacent one of the thermoelectric conversion elements in the Y-axis direction, the X-axis connectors are disposed between adjacent thermoelectric conversion elements in the X-axis direction, and the Y-axis connectors connect the first electrodes and the second electrodes at ends in the X-axis direction of adjacent thermoelectric conversion elements in the Y-axis direction.

4. The thermoelectric conversion module as claimed in claim 1, wherein the substrates are cold side substrates disposed on a cold side, and wherein, on a hot side, a hot side substrate is provided for each one of the thermoelectric conversion elements.

5. The thermoelectric conversion module as claimed in claim 1, wherein the plurality of thermoelectric conversion elements includes either n-type thermoelectric conversion elements, p-type thermoelectric conversion elements, or both n-type thermoelectric conversion elements and p-type thermoelectric conversion elements, and wherein the plurality of thermoelectric conversion elements is electrically connected in series.

\* \* \* \* \*